(12) United States Patent
Suda et al.

(10) Patent No.: US 7,558,692 B2
(45) Date of Patent: Jul. 7, 2009

(54) CONSUMPTION CURRENT BALANCE CIRCUIT, COMPENSATION CURRENT AMOUNT ADJUSTING METHOD, TIMING GENERATOR, AND SEMICONDUCTOR TESTING APPARATUS

(75) Inventors: Masakatsu Suda, Tokyo (JP); Satoshi Sudou, Tokyo (JP)

(73) Assignee: Advantest Corp., Tokyo (JP)

( * ) Notice: Subject to any disclaimer, the term of this patent is extended or adjusted under 35 U.S.C. 154(b) by 324 days.

(21) Appl. No.: 11/663,793

(22) PCT Filed: Sep. 14, 2005

(86) PCT No.: PCT/JP2005/016953

§ 371 (c)(1),
(2), (4) Date: Mar. 23, 2007

(87) PCT Pub. No.: WO2006/035604

PCT Pub. Date: Apr. 6, 2006

(65) Prior Publication Data

US 2008/0116901 A1    May 22, 2008

(30) Foreign Application Priority Data

Sep. 27, 2004   (JP) ............................. 2004-280420

(51) Int. Cl.
*G06F 19/00* (2006.01)

(52) U.S. Cl. .................. 702/107; 365/189.05; 365/236; 365/233.13; 365/233.11; 365/229; 365/194; 365/233; 327/160; 327/161; 327/162; 327/163; 327/156

(58) Field of Classification Search ................. 702/107; 365/189.05, 195, 193, 236, 233.13, 233.11, 365/229, 194, 233, 230.08, 149, 226, 227, 365/233.17, 233.1; 327/141, 155, 160, 161, 327/162, 163, 158, 156; 324/555; 331/173, 331/70, 17, 1 A, 25, 8

See application file for complete search history.

(56) References Cited

U.S. PATENT DOCUMENTS 5,886,564 A * 3/1999 Sato et al. .................... 327/513
6,160,755 A * 12/2000 Norman et al. ......... 365/233.15
6,574,200 B1 * 6/2003 Tsumura ..................... 370/311

(Continued)

FOREIGN PATENT DOCUMENTS

JP    08-330920    12/1996

(Continued)

*Primary Examiner*—Carol S Tsai
(74) *Attorney, Agent, or Firm*—Muramatsu & Associates (57) ABSTRACT

A consumption current balance circuit reduces the layout area and suppresses the deterioration of accuracy of a delay time caused by a temperature variation due to a power variation of a delay circuit itself or caused by a load variation of a power supply. The consumption current balance circuit includes a delay circuit for giving a delay time to a timing pulse signal, a compensation circuit for interpolating the consumption current of the delay circuit, a ring oscillator provided in the same power supply area as the delay circuit; an output period counter for measuring the output period of the ring oscillator; and a heater circuit current amount adjusting circuit for adjusting the current amount of the heater circuit to minimize the difference in the output period between the stand-by state and the active state of the ring oscillator.

6 Claims, 11 Drawing Sheets

U.S. PATENT DOCUMENTS

| | | | |
|---|---|---|---|
| 6,678,206 B2 * | 1/2004 | Chu et al. | 365/189.08 |
| 7,139,210 B2 * | 11/2006 | Kwack et al. | 365/189.08 |
| 7,294,998 B2 * | 11/2007 | Chiba | 324/158.1 |
| 7,428,183 B2 * | 9/2008 | Kwack et al. | 365/233.1 |
| 2002/0136082 A1 * | 9/2002 | Chu et al. | 365/233 |
| 2006/0087308 A1 * | 4/2006 | Negishi et al. | 324/76.55 |
| 2006/0267656 A1 * | 11/2006 | Suda et al. | 327/261 |

FOREIGN PATENT DOCUMENTS

| | | |
|---|---|---|
| JP | 11-074768 | 3/1999 |
| JP | 2000-275309 | 10/2000 |
| JP | 2003-279629 | 10/2003 |
| JP | 2004-184345 | 7/2004 |

* cited by examiner

CONSUMPTION CURRENT BALANCE CIRCUIT, COMPENSATION CURRENT AMOUNT ADJUSTING METHOD, TIMING GENERATOR, AND SEMICONDUCTOR TESTING APPARATUS

TECHNICAL FIELD

The present invention relates to a consumption current balance circuit comprising a delay circuit for giving a delay time to a timing pulse signal and a compensation circuit for interpolating the consumption current of the delay circuit; a method of adjusting a compensation current amount in the consumption current balance circuit; a timing generator comprising the consumption current balance circuit; and a semiconductor testing apparatus. More particularly, the present invention relates to a consumption current balance circuit, a compensation current amount adjusting method, a timing generator, and a semiconductor testing apparatus which are suitable to adjust the amount of a compensation current of a compensation circuit.

BACKGROUND ART

Prior to describing the present invention, the outline of a conventional semiconductor testing apparatus will be described with reference to FIG. 6.

Figure 6:
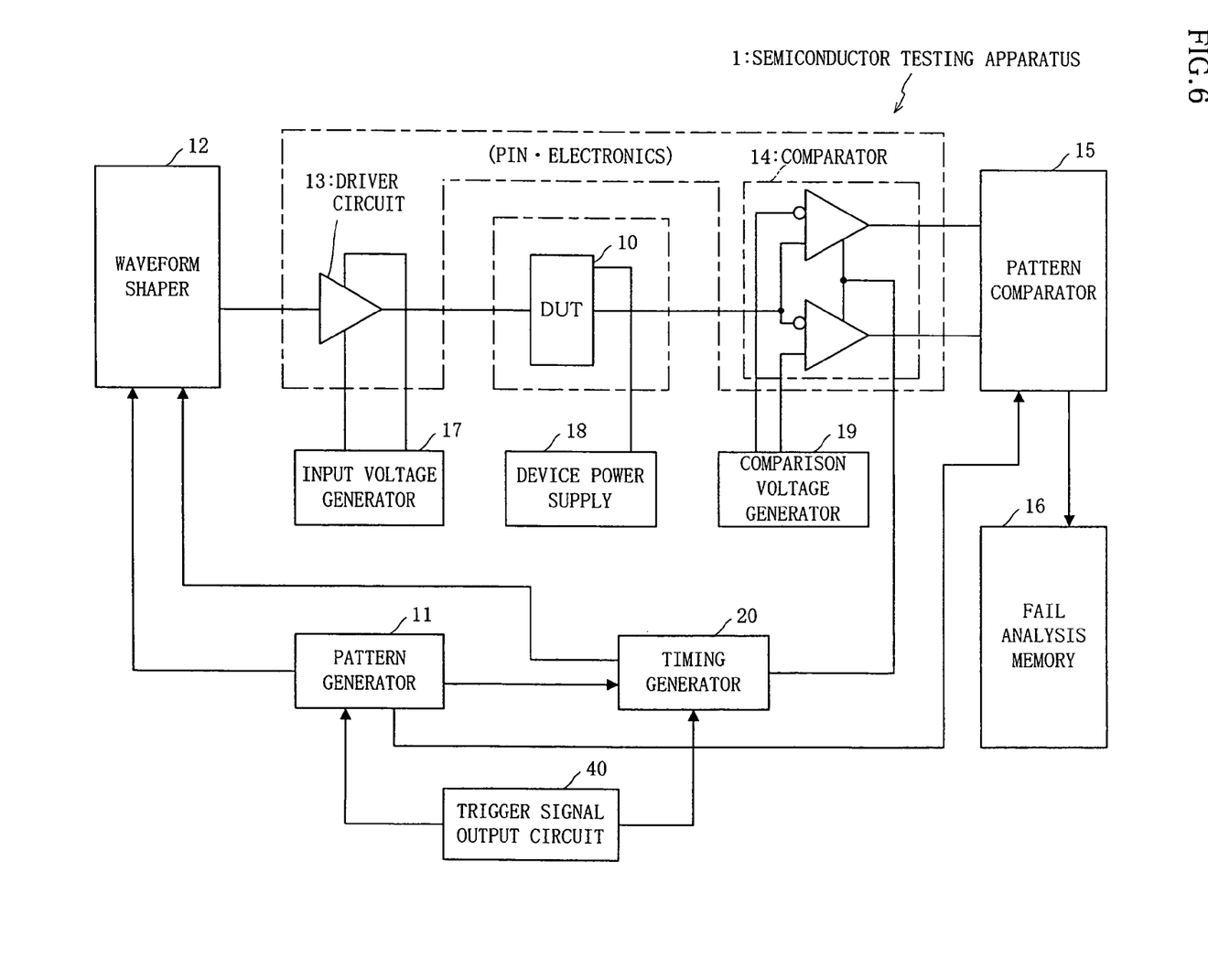
FIG. 6 is a block diagram showing the configuration of a semiconductor testing apparatus of the present invention.

As shown in FIG. 6, a semiconductor testing apparatus 1 which sets a semiconductor integrated circuit (device under test: DUT) 10 as a test target comprises: as the main components, a test processor (not shown) for controlling the whole semiconductor testing apparatus 1; a pattern generator 11 for generating a test pattern, an expected value pattern or the like; a waveform shaper 12 for shaping the test pattern from the pattern generator 11 into a test signal waveform; a driver circuit 13 for sending the test signal waveform shaped in the waveform shaper 12 to the DUT 10; a pattern comparator 15 for logically comparing a test result sent from the DUT 10 via a comparator 14 with the expected value pattern from the pattern generator 11 to detect whether they correspond to each other in order to judge whether the DUT 10 is acceptable; a timing generator 20 for generating a timing pulse signal and then applying the timing pulse signal to the waveform shaper 12, the comparator 14, the pattern comparator 15, etc. to set the timing of a test; a trigger signal output circuit 40 for outputting a trigger signal to the pattern generator 11 and the timing generator 20, etc.

Among these components, the timing generator 20 generates a clock to which a predetermined delay time has been given from reference timing, and outputs this clock as a timing pulse signal.

The configuration and operation of this timing generator 20 will be explained with reference to FIGS. 7 and 8.

Figure 8:
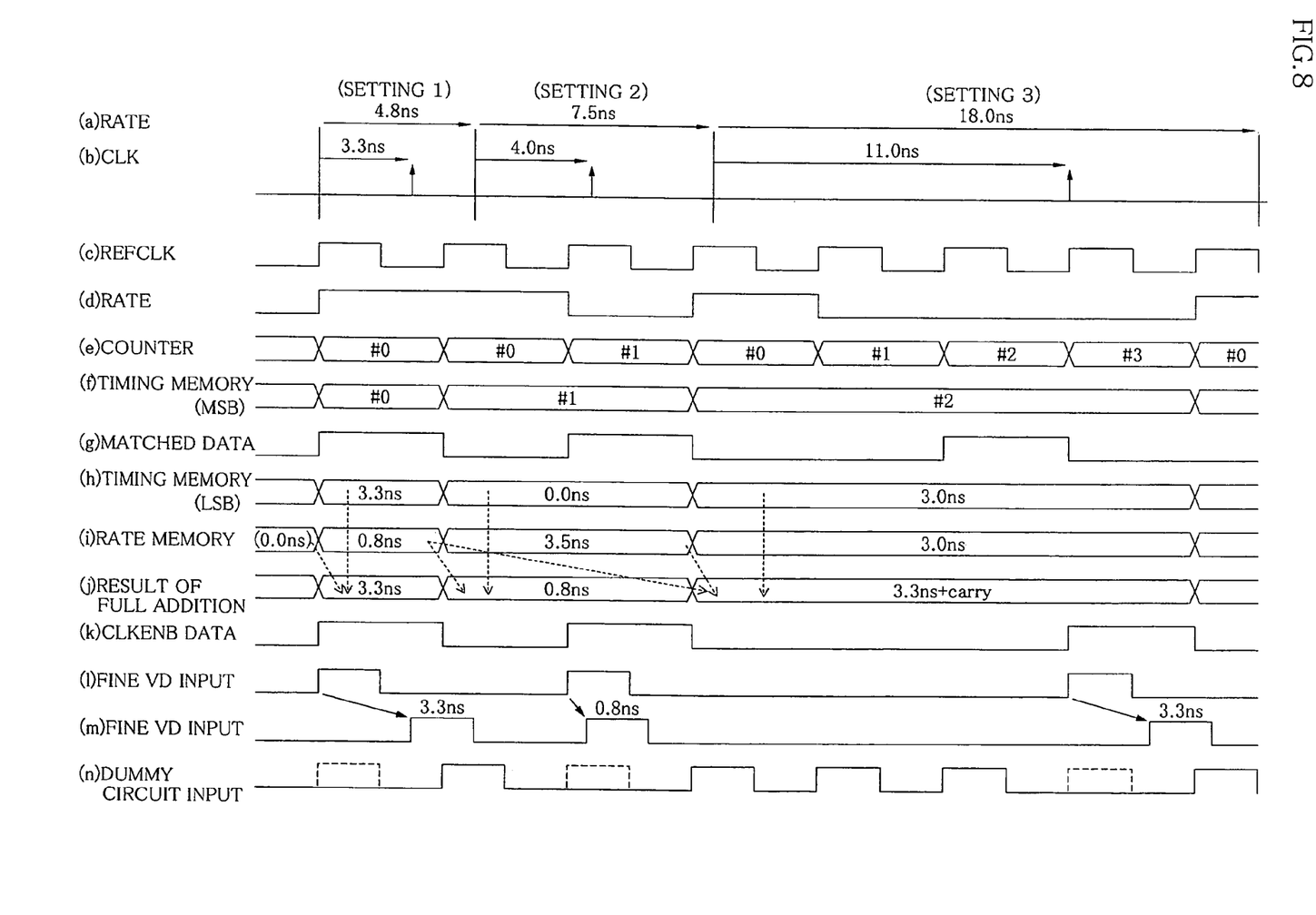
FIG. 8 is a timing chart showing changes over time of various signals output by the conventional timing generator.

It is to be noted that, in this explanation, a "setting 1" includes RATE 4.8 [ns] and CLK 3.3 [ns], a "setting 2" includes RATE 7.5 [ns] and CLK 4.0 [ns], and a "setting 3" includes RATE 18.0 [ns] and CLK 1.0 [ns], as shown in (a) and (b) in FIG. 8.

Moreover, the period of a reference clock (REFCLK) is 4 [ns] ((c) in FIG. 8).

A RATE signal sends "H" for one DATA RATE with the resolution of a basic period and with the timing of the start of RATE ((d) in FIG. 8).

A RATE setting (RATE high resolution data) for the basic period or less is written in advance in a rate memory 21, and output in response to an address signal (TS signal) of a memory synchronous with the RATE signal.

It is to be noted that the high resolution data is added to the RATE signal in real time, and the RATE signal is shifted one cycle and input to a period counter (COUNTER) 22 when a carry emerges.

In response to the RATE signal, "#0" is loaded into the period counter 22 synchronously with REFCLK, and the period counter 22 counts REFCLK ((e) in FIG. 8).

In a timing memory 23, delay data which is the integral multiple of the REFCLK period has been written in a high order (MSB), and delay data equal to or less than the REFCLK period has been written in a low order (LSB), and they are output in response to the address signal (TS signal) of the memory synchronized with the RATE signal.

The high order of the timing memory 23 and the period counter 22 correspond to each other in all bits, and CLKENB data penetrating REFCLK is only output at a cycle where they correspond to each other ((e), (f) and (g) in FIG. 8).

The output of the rate memory 21 is added to data of a previous cycle in real time, and period components equal to or less than the REFCLK period of the RATE signal are generated as data ((h), (i) and (j) in FIG. 8).

It is to be noted that dotted arrows in FIG. 8 signify additions.

Moreover, addition is continued for the data of the rate memory since the start of an operation, and fractions of the RATE settings are calculated in real time.

Furthermore, lower bits of the timing memory 23 are added to the data, and the carry is used as a control signal for delaying a CLKENB signal ((k) in FIG. 8) for one cycle, and then the result of the addition is coupled with the phase of the data (via a FIFO 24) for use as a control signal of a delay circuit (FINE VD1) 25-1 and a delay circuit (FINE VD2) 25-2 (hereinafter collectively referred to as a "delay circuit 25".) ((l) and (m) in FIG. 8).

The delay circuit 25 has the same variable amount as that of the REFCLK period, and adds a delay in real time in accordance with the control signal of the delay circuit 25.

Meanwhile, in the timing generator 20, a power supply may be divided so that electricity is supplied to the delay circuit 25 from another system in order to prevent the wraparound of power supply noise generated in logic circuits of the memory, the counter, etc.

In this case, the electric power consumption of the delay circuit 25 can be interpolated to always keep in the vicinity of the maximum electric consumption current regardless of operation modes.

For this interpolation of the electric power, various techniques have heretofore been proposed.

Figure 7:
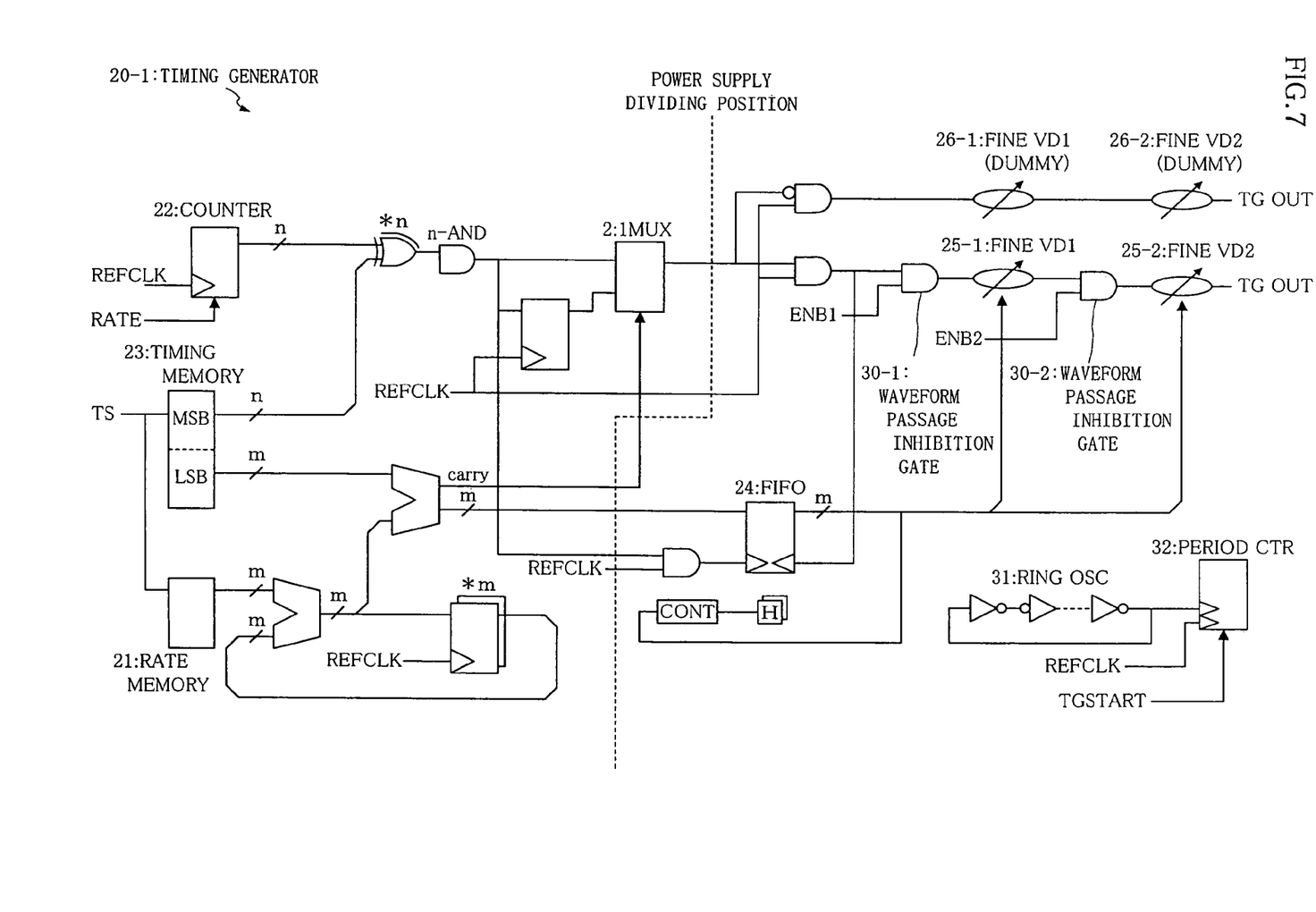
FIG. 7 is a circuit diagram showing the configuration of a conventional timing generator.

For example, as shown in FIG. 7, a dummy circuit (FINE VD1 (Dummy)) 26-1 and a dummy circuit (FINE VD2 (Dummy)) 26-2 (hereinafter collectively referred to as a "dummy circuit 26".) that have the same electric power consumption are laid out in the vicinity of the delay circuit 25, and when REFCLK is penetrated by the inversion logic of the CLKENB data, the electric power consumption can be interpolated (e.g., refer to Patent document 1, first prior art.).

Figure 9:
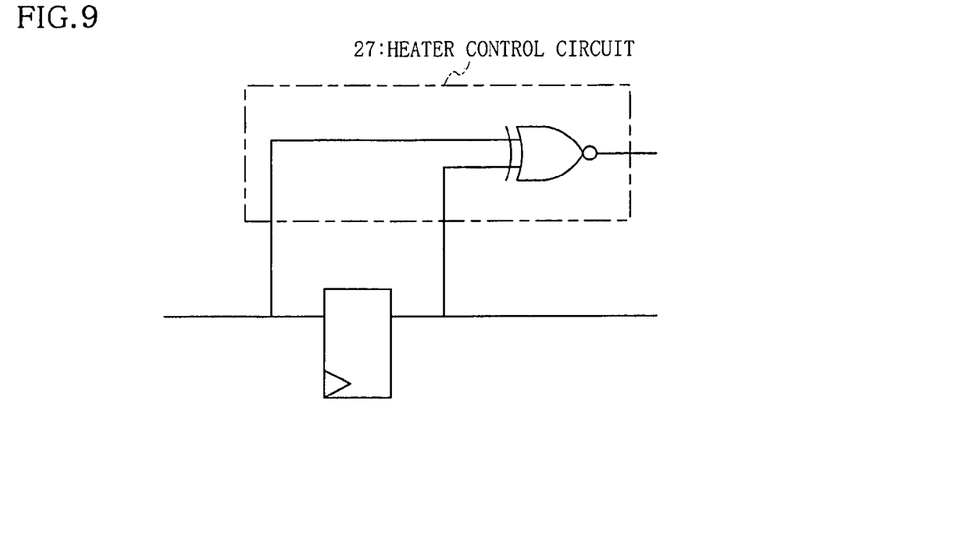
FIG. 9 is a circuit diagram showing the configuration of a conventional heater control circuit.
Figure 10:
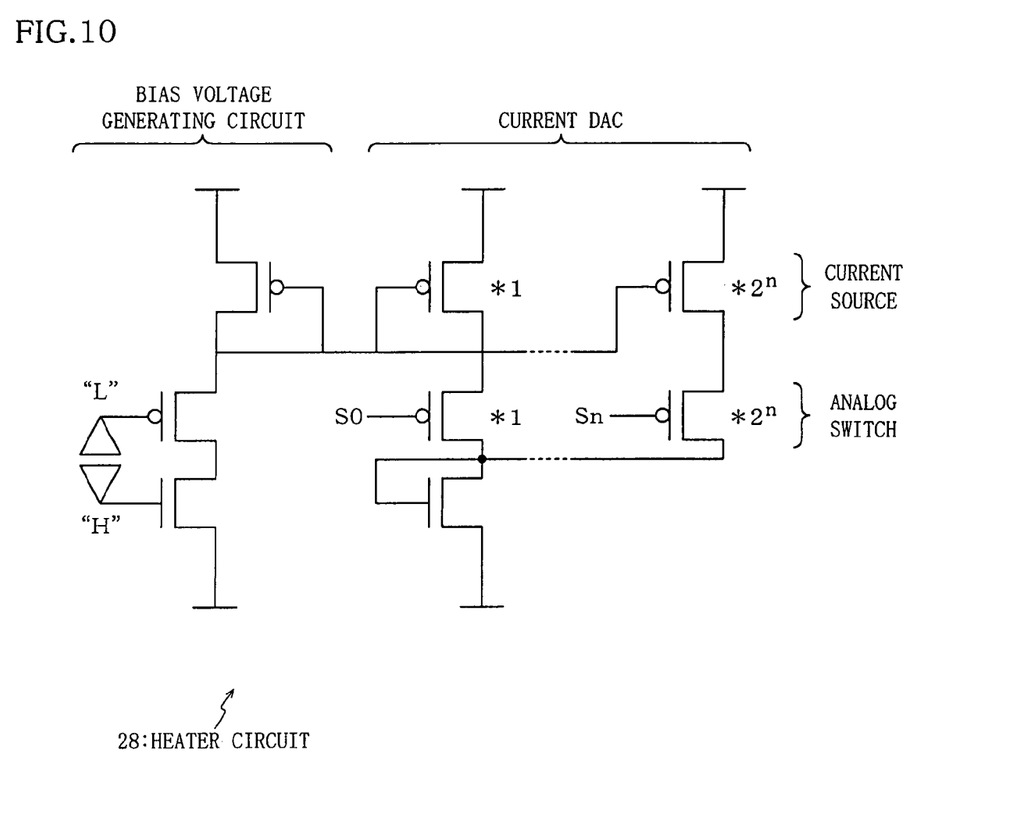
FIG. 10 is a circuit diagram showing the configuration of a conventional heater circuit.

Furthermore, because a circuit which propagates the high resolution data for controlling the delay amount of the delay circuit 25 in real time is also laid out on the periphery of the delay circuit 25, there has also been proposed the interpolation of the electric power consumption by the combination of a control circuit (heater control circuit 27) shown in FIG. 9 and a heater circuit 28 shown in FIG. 10.

Figure 11:
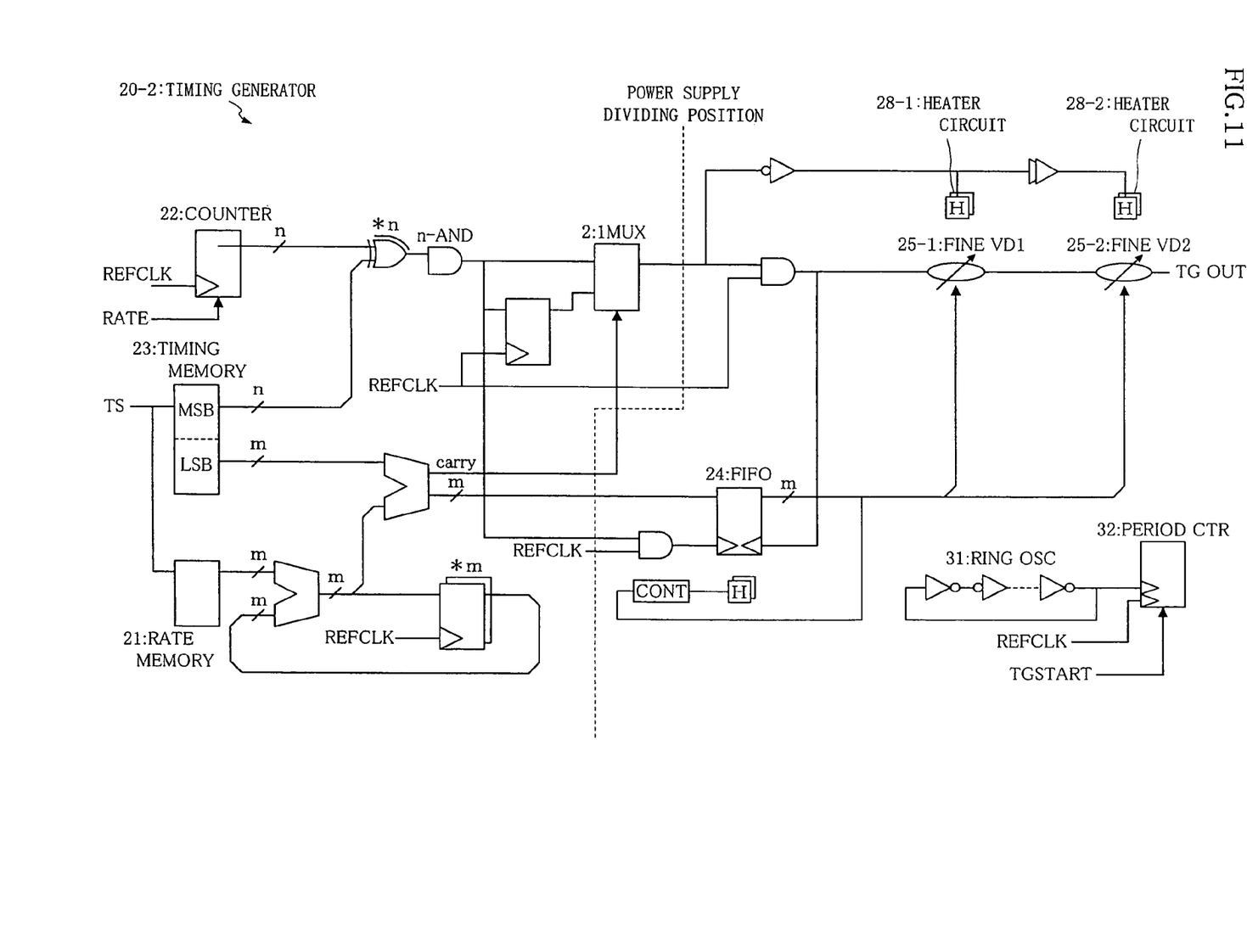
FIG. 11 is a circuit diagram showing another configuration of the conventional timing generator.

Still further, there has also been a proposal to use the heater circuit 28 shown in FIG. 10 instead of the dummy circuit 26 shown in FIG. 7 (see FIG. 11, second prior art.).

Figure 12:
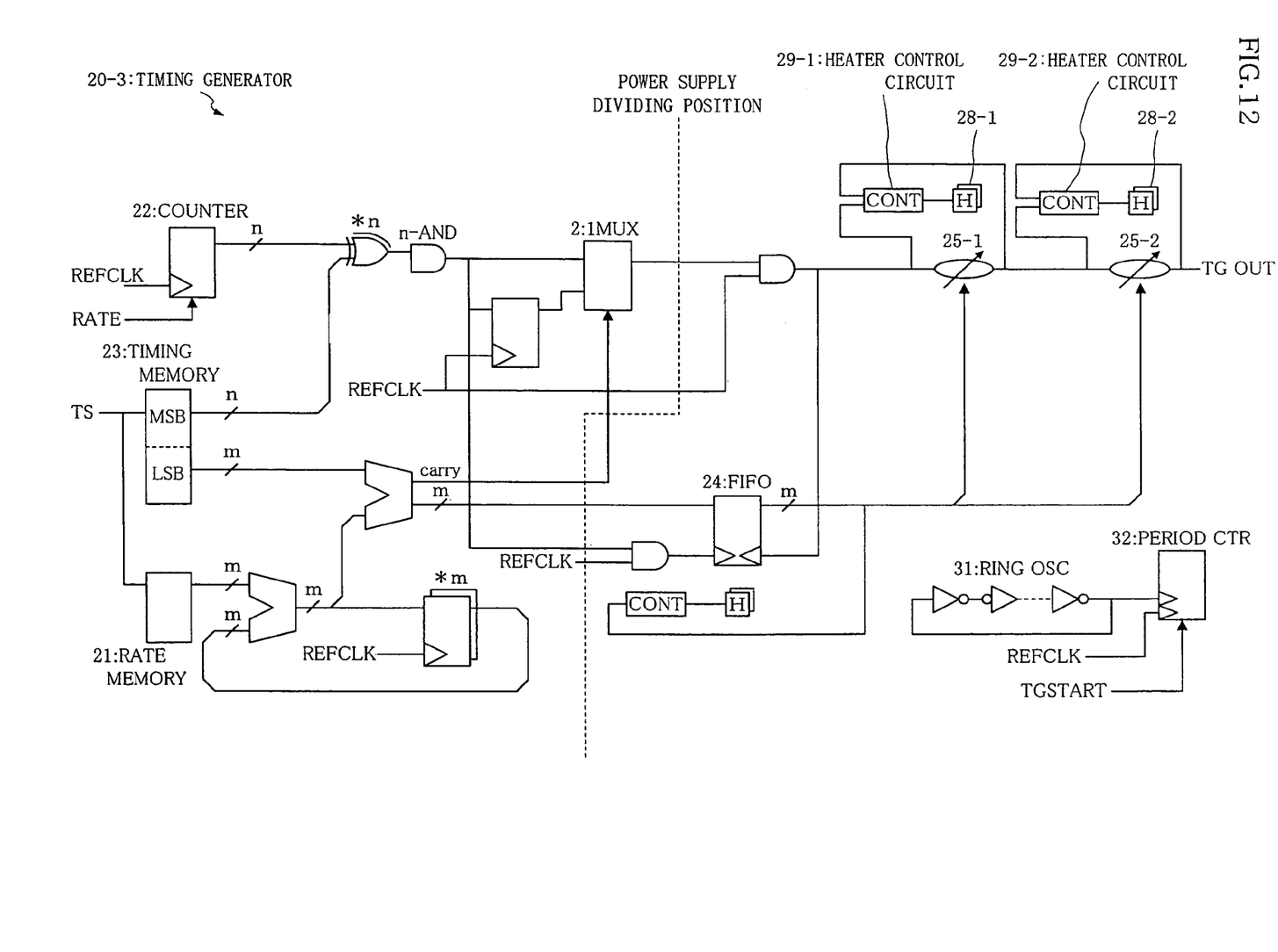
FIG. 12 is a circuit diagram showing still another configuration of the conventional timing generator.

Further yet, as shown in FIG. 12, there has also been a proposal using the heater circuits 28 and heater control circuits 29 (e.g., refer to Patent document 2, third prior art.). In this configuration, the heater control circuits 29 is provided to detect the front edge and rear edge of an input pulse and the front edge and rear edge of an output pulse of a pulse signal which is input to, propagated through and output from the delay circuit (CMOS circuit), and thus output a front edge passage period signal and a rear edge passage period signal. There are disposed, in the vicinity of the CMOS circuit, a front edge compensation heater 28-1 for always passing a constant consumed current when no pulse signal is present, and shutting off the constant consumed current only during a period in which the front edge passage period signal is received, and a rear edge compensation heater 28-2 for shutting off the constant consumed current only during a period in which the rear edge passage period signal is received.

Patent document 1: Japanese Patent Publication Laid-open No. 8-330920

Patent document 2: Japanese Patent Publication Laid-open No. 11-074768

DISCLOSURE OF THE INVENTION

However, it is true that the first prior art is effective, but it provides an increased layout area because the delay circuit 25 is doubly laid out.

Furthermore, because the input pulse signal of the delay circuit 25 is asynchronous with the input pulse signal of the dummy circuit 26, the sum of the consumption amount and the interpolation amount of consumed electric power is not constant due to a variation between the delay circuit 25 and the dummy circuit 26, and the consumed current changes with the change of operation modes, so that there is a possibility of accuracy deterioration resulting from a temperature variation and a load variation of the power supply.

Still further, in the second prior art and the third prior art, because the delay circuit 25 is interpolated by the heater circuit 28 completely different from this delay circuit 25, the sum of the consumption amount and the interpolation amount of the consumed electric power is not constant due to a variation between the circuits, and the consumed current changes with the change of operation modes, so that there is a possibility of accuracy deterioration resulting from a temperature variation and a load variation of the power supply. Thus, even if the current of the conventional heater circuit is variable, it is not possible to carry out an accurate measurement so that the sum of the consumption amount and the interpolation amount is constant.

Further yet, since a circuit for transmitting data is interpolated by the heater circuit completely different from a circuit such as a D-FF, the sum of the consumption amount and the interpolation amount of the consumed electric power is not constant due to a variation even if they are adjusted by a simulation, and the consumed current changes due to the change of operation modes, so that there is a possibility of accuracy deterioration resulting from a temperature variation and a load variation of the power supply.

In particular, in the CMOS, the variation between the circuits has increased (in proportion to an inverse number 1/SQRT (L*W) of the square root of a gate width*a gate length) along with the advance of miniaturization. In addition, an increase of the variation in form of positive feedback has also been conceivable due to a reduced power supply voltage. Therefore, there has been a problem that, in an interpolation circuit of the consumed electric power, the simple adjustment by the simulation increases the accuracy deterioration due to the disagreement between the consumption amount and the interpolation amount of the consumed electric power.

The present invention has been made in view of such circumstances, and is directed to provide a consumption current balance circuit, a compensation current amount adjusting method, a timing generator, and a semiconductor testing apparatus capable of reducing the layout area of a compensation circuit, and suppressing a variation between a delay circuit and a heater circuit so that the sum of the consumption amount and the interpolation amount of consumed electric power is constant in order to suppress accuracy deterioration resulting from a temperature variation of the delay circuit itself and a load variation of a power supply.

In order to achieve this object, a consumption current balance circuit of the present invention includes a delay circuit to give a delay time to an output signal, and a compensation circuit to interpolate a consumption current of the delay circuit, and the consumption current balance circuit comprises: a heater circuit provided as the compensation circuit in the vicinity of the delay circuit; an oscillator provided in the same power supply area as the delay circuit; a period counter which measures an output period of the oscillator; and a heater circuit current amount adjusting circuit which adjusts the current amount of the heater circuit so as to minimize the difference between the output period of the oscillator in an inactive state and the output period of the oscillator in an active state.

When the consumption current balance circuit has such a configuration, the heater circuit is provided as the compensation circuit, so that the layout area can be reduced as compared with the case where a dummy circuit having the same configuration as that of the delay circuit is additionally provided as the compensation circuit.

Moreover, the current amount of the heater circuit is adjusted so as to minimize the difference between the output period of the oscillator in the inactive state and the output period of the oscillator in the active state. Thus, the variation between the delay circuit and the heater circuit can be suppressed so that the sum of the consumption amount and the interpolation amount of consumed electric power is constant, thereby making it possible to suppress accuracy deterioration resulting from a temperature variation and a load variation of a power supply.

Furthermore, the consumption current balance circuit of the present invention comprises a waveform passage inhibition gate which inhibits the passage of a waveform for each stage of the delay circuit, and the heater circuit current amount adjusting circuit adjusts the current amount of the heater circuit for each stage and/or for each circuit so as to minimize the difference between the output period of the oscillator in the inactive state and the output period of the oscillator in each active state for each stage of the delay circuit.

Figure 1:
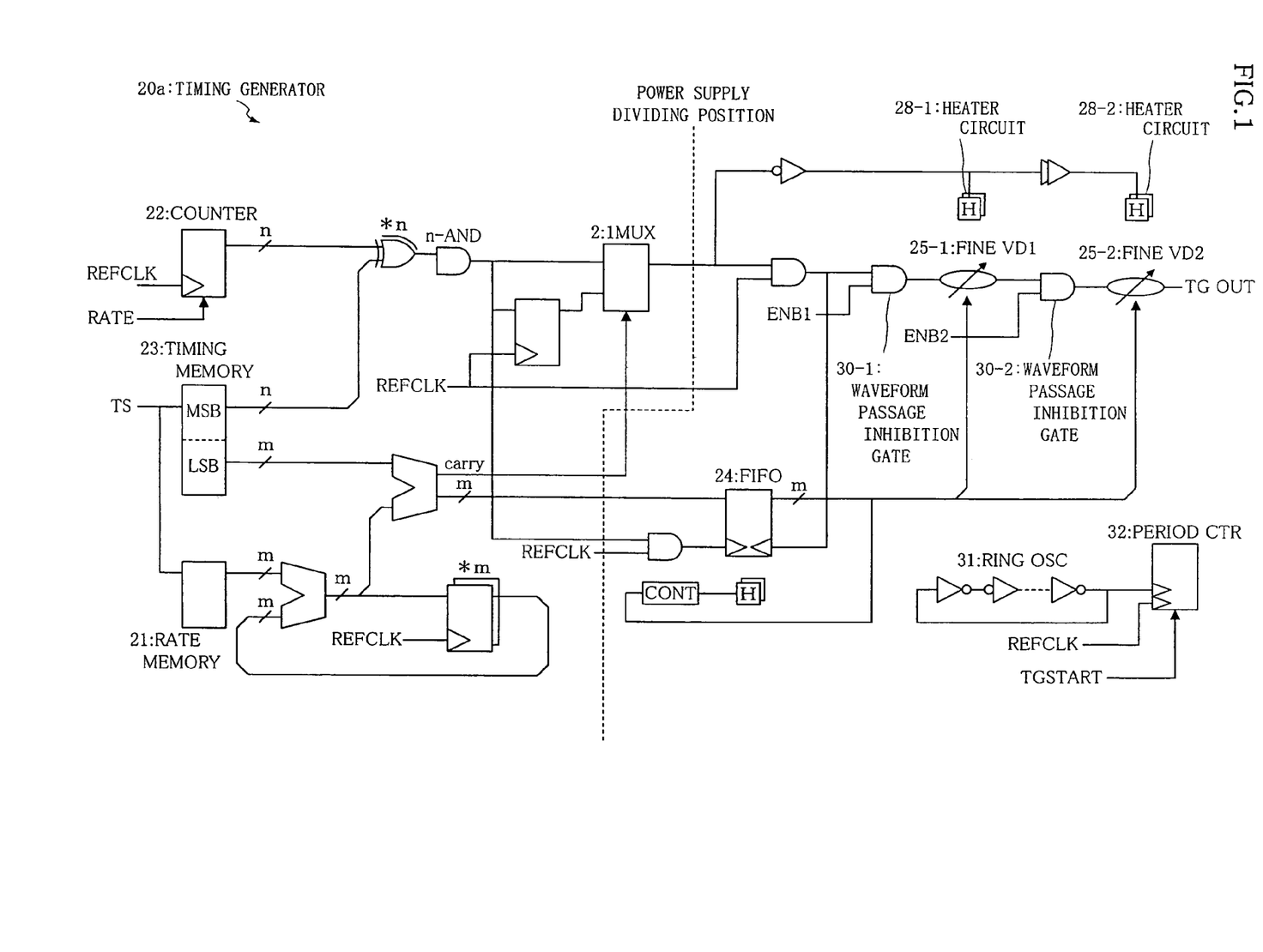
FIG. 1 is a circuit diagram showing the configuration of a timing generator of the present invention.

It is to be noted that the "stage" means, in FIG. 1, a part interposed between the waveform passage inhibition gates in the delay circuit. The range of the stage is defined in this manner, such that the stage indicates a unit in which the consumption current due to the passage of a pulse can be controlled.

When the consumption current balance circuit has such a configuration, the current amount of the heater circuit is adjusted so as to minimize the difference between the output period of the oscillator in each active state for each stage of the delay circuit and the output period of the oscillator in the inactive state. Thus, the variation between the delay circuit and the heater circuit can be suppressed so that the sum of the consumption amount and the interpolation amount of consumed electric power is constant. It is therefore possible to suppress the accuracy deterioration resulting from the temperature variation of the delay circuit itself and the load variation of the power supply.

Furthermore, a compensation current amount adjusting method of the present invention adjusts the amount of a compensation current running in a heater circuit to interpolate the consumption current of a delay circuit, and the method comprises the steps of: measuring an output period of an oscillator provided in the same power supply area as the delay circuit by use of a period counter in an inactive state; switching a waveform passage inhibition gate so that the delay circuit operates for each stage; measuring the output period of the oscillator in an active state of the stages for each stage of the delay circuit by use of the period counter; and adjusting, by use of a heater circuit current amount adjusting circuit, the current amount of the heater circuit so as to minimize the difference between the output period of the oscillator in an inactive state and the output period of the oscillator in the active state for each stage of the delay circuit.

When the compensation current amount adjusting method is as described above, the oscillator is provided in the same power supply area as the delay circuit, and the current amount of the heater circuit can be adjusted so as to minimize the difference between the output period from the oscillator measured in the inactive state and the output period from the oscillator in the active state for each stage of the delay circuit. Thus, the consumption amount of a current in the delay circuit and the interpolation amount in the heater circuit can be constant. It is therefore possible to equalize the amount of consumption current of the entire circuit (addition of the delay circuit and the heater circuit) to suppress a change in a delay time given to an output signal (timing pulse signal) even if the temperature variation of the delay circuit and the load variation of the power supply are caused.

Furthermore, a timing generator of the present invention includes: a delay circuit to give a delay time to a timing pulse signal; and a compensation circuit to interpolate a consumption current of the delay circuit, and the timing generator comprises a consumption current balance circuit which adjusts the amount of a compensation current running in the compensation circuit, wherein the consumption current balance circuit includes the consumption current balance circuit described above (consumption current balance circuit according to claim 1 or 2).

When the timing generator has such a configuration, the consumption current balance circuit is provided in the timing generator, and this consumption current balance circuit can adjust, together with a period counter which measures the output period of the oscillator, the current amount of the heater circuit so as to minimize the difference between the output period of the oscillator in the inactive state and the output period of the oscillator in the active state.

Thus, it is possible to suppress the accuracy deterioration of the delay time resulting from the temperature variation of the delay circuit and the load variation of the power supply.

Moreover, the timing generator of the present invention comprises a trigger signal output circuit which outputs a trigger signal to perform a timing generation operation, and the period counter of the consumption current balance circuit measures the output period of the oscillator provided in the same power supply area as the delay circuit when the trigger signal is output from the trigger signal output circuit to start the timing generation operation.

On receipt of an instruction for timing generation from a test processor (a computer unit of a semiconductor testing apparatus), the trigger signal output circuit outputs a trigger signal to the timing generator, and the timing generator generates timing after a specified time from the trigger signal.

When the timing generator has such a configuration, the output period of the oscillator is measured from the point of the start of the timing generation operation, so that the amount of a compensation current in the heater circuit is adjusted, thereby making it possible to output a timing pulse signal with a highly accurate delay time.

Furthermore, a semiconductor testing apparatus of the present invention includes: a timing generator which outputs a delayed clock signal obtained by delaying a reference clock signal for a predetermined time; a pattern generator which outputs a test pattern signal synchronously with the reference clock signal; a waveform shaper which shapes the test pattern signal in accordance with a device under test and sends the shaped test pattern signal to the device under test; and a logical comparator which compares a response output signal of the device under test with an expected value data signal, wherein the timing generator includes the timing generator according to claim 4 or 5.

When the semiconductor testing apparatus has such a configuration, the timing generator can output a timing pulse signal with a highly accurate delay time, such that it is possible to carry out a more accurate performance test of a semiconductor.

As described above, according to the present invention, the current amount of the heater circuit is adjusted so as to minimize the difference between the output period of the oscillator in the inactive state and the output period of the oscillator in the active state for each stage of the delay circuit. Thus, the variation between the delay circuit and the heater circuit can be suppressed so that the sum of the consumption amount and the interpolation amount of consumed electric power is constant. It is therefore possible to suppress the accuracy deterioration of the delay time resulting from the temperature variation and the load variation of the power supply.

Moreover, since the heater circuit is provided as the compensation circuit, the layout area can be reduced as compared with the case where a dummy circuit is provided as the compensation circuit.

BEST MODE FOR CARRYING OUT THE INVENTION

A preferred embodiment of a consumption current balance circuit, a compensation current amount adjusting method, a timing generator, and a semiconductor testing apparatus according to the present invention will hereinafter be described with reference to the drawings.

First, the embodiment of the consumption current balance circuit of the present invention and the timing generator comprising this consumption current balance circuit will be described with reference to FIG. 1.

FIG. 1 is a circuit diagram showing the configuration of the timing generator in the present embodiment.

As shown in FIG. 1, a timing generator 20a has, as the main components, a rate memory 21, a period counter (COUNTER) 22, a timing memory 23, a FIFO 24, a delay circuit (FINE VD1) 25-1, a delay circuit (FINE VD2) 25-2, a heater circuit 28-1, a heater circuit 28-2, a waveform passage inhibition gate 30-1, a waveform passage inhibition gate 30-2, a ring oscillator (RING OSC) 31, an output period counter (PERIOD CTR) 32, and a heater current amount adjusting circuit 33.

It is to be noted that the main components such as the rate memory 21 are only explained by way of example for convenience of explanation in the present embodiment, but the components of the timing generator in the present embodiment are not limited to the components such as the rate memory 21, and the timing generator also comprises other components necessary for outputting a timing pulse signal.

Furthermore, in the present embodiment, a circuit is called a "consumption current balance circuit" which includes the delay circuit 25-1 and the delay circuit 25-2 (hereinafter collectively referred to as a "delay circuit 25"), the heater circuit 28-1 and the heater circuit 28-2 (hereinafter collectively referred to as a "heater circuit 28"), the waveform passage inhibition gate 30-1 and the waveform passage inhibition gate 30-2 (hereinafter collectively referred to as a "waveform passage inhibition gate 30"), the ring oscillator 31, and the output period counter 32.

Here, the rate memory 21, the period counter 22, the timing memory 23 and the FIFO 24 have the same functions as a rate memory 21, a period counter 22, a timing memory 23 and a FIFO 24 of a timing generator 20-1 shown in FIG. 7, and these are therefore not explained.

For the delay circuit 25, it is possible to use a CMOS circuit configured by a CMOS type IC including an LSI.

This delay circuit 25 gives a delay time (slight delay) to the timing pulse signal (output signal), and a consumed current i runs at the rising edge and falling edge of the timing pulse signal. This consumed current i influences the temperature within the IC and the propagation delay amount and a drive voltage of the CMOS circuit.

The heater circuit (compensation current) 28 can be configured by a current source, a switch, a resistor or the like, and is disposed in the vicinity of the delay circuit 25 to interpolate the consumed current i of the delay circuit 25.

Figure 2:
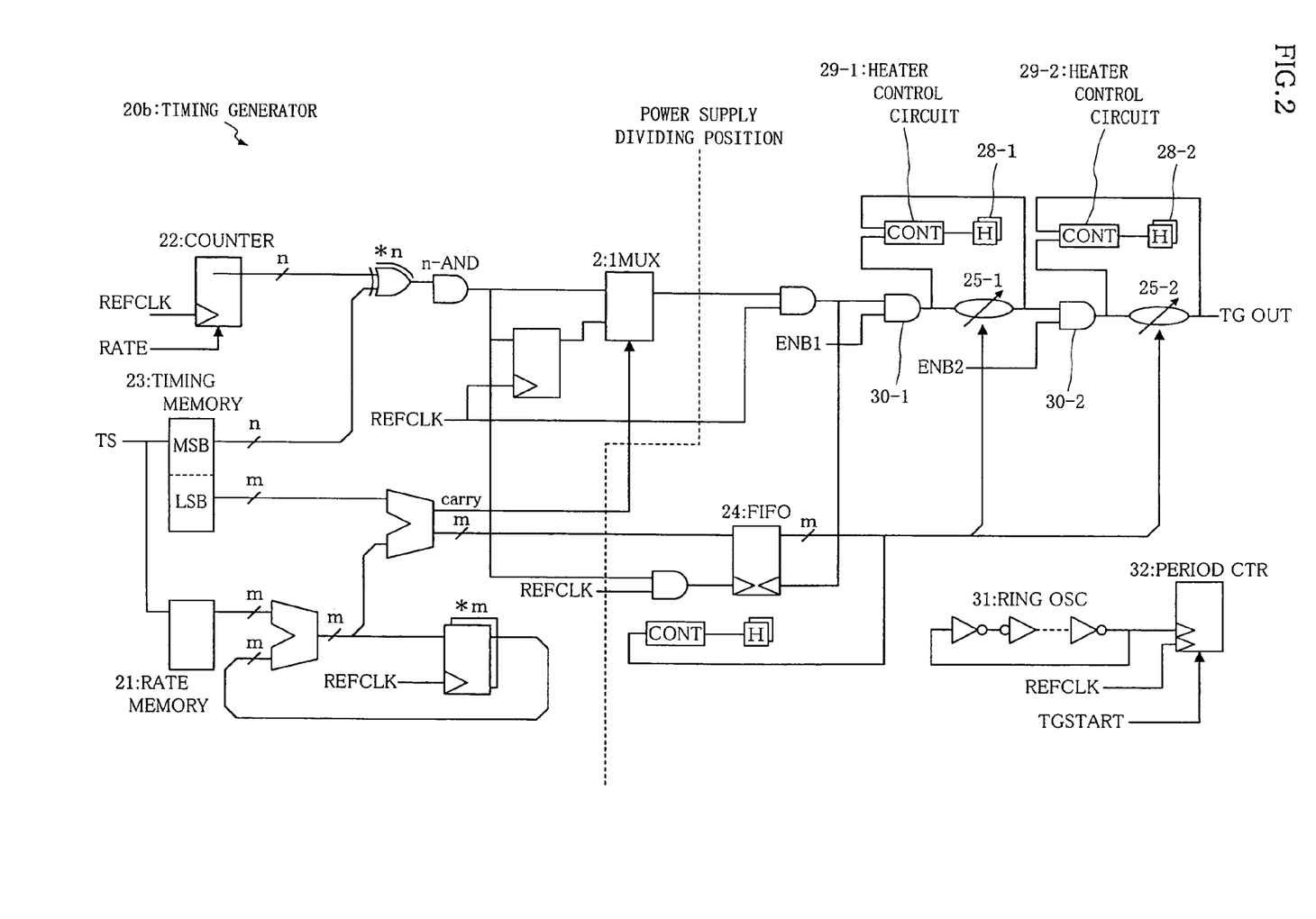
FIG. 2 is a circuit diagram showing another configuration of the timing generator of the present invention.

It is to be noted that a heater control circuit 29-1 and a heater control circuit 29-2 (hereinafter collectively referred to as a "heater control circuit 29") can be provided as shown in FIG. 2 to control a compensation current of the heater circuit 28.

The heater control circuit 29 has a function and configuration similar to those of a heater control circuit 29 shown in FIG. 12.

The waveform passage inhibition gate 30 is provided for each stage of the delay circuit 25, and inhibits the passage of waveforms sent to the delay circuit 25.

The ring oscillator 31 is, as shown in FIG. 1, a circuit in which n inverters are connected in series to feed back its out signal to its input side to cause oscillation, and the ring oscillator 31 is laid out in the same power supply area as the delay circuit 25.

The output period counter (period counter) 32 measures the period of the output signal of the ring oscillator 31 in response to a trigger signal (TGSTART).

The heater current amount adjusting circuit 33 varies the current amount (compensation current amount) of the heater circuit 28. Each stage or each circuit of the heater circuit 28 has a current amount, which can be varied by the heater current amount adjusting circuit 33.

This heater current amount adjusting circuit 33 may have the same configuration as, for example, that of a heater circuit shown in FIG. 10, and may receive S0 to Sn from a register and a memory.

In the heater circuit shown in FIG. 10, Pch*two stages+Nch*one stage on the left side serve as a circuit for generating a bias voltage, and the right side serves as a DAC for receiving the bias voltage to convert the digital data (S0 to Sn) into a current. The lower Nch of the DAC is not a transistor used as a current source, but is used as a resistance component.

It is to be noted that in the timing generator 20, there has heretofore been a signal called a trigger signal (TGSTART) for performing a timing generating operation. This is output from a trigger signal output circuit 40. The timing generator in the present embodiment has a function of measuring, in response to the trigger signal, the period of the period counter in accordance with the start of the timing generating operation.

Next, a method of adjusting the current amount of the heater circuit in the timing generator of the present embodiment (compensation current amount adjusting method) will be explained with reference to FIG. 3.

Figure 3:
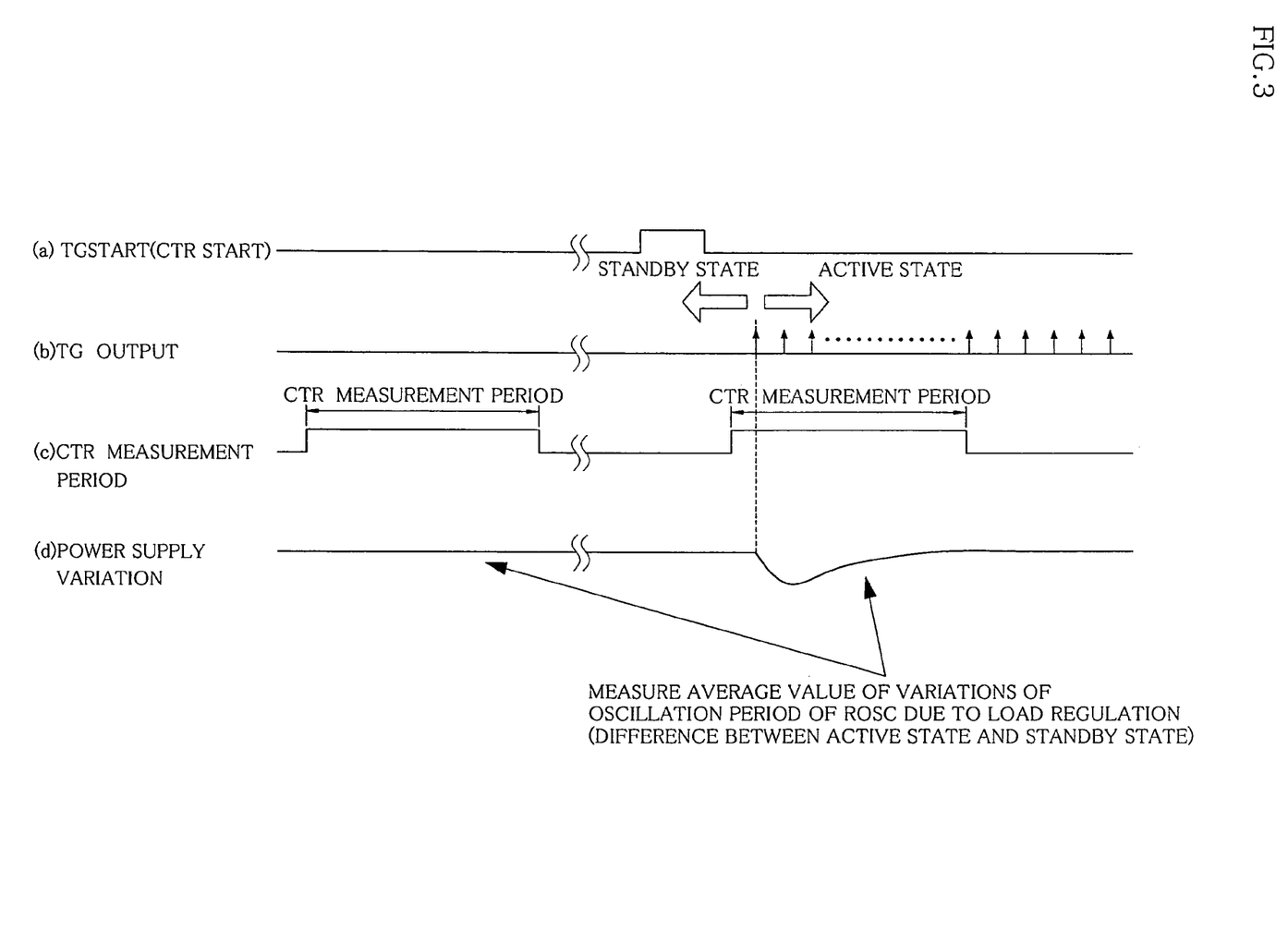
FIG. 3 is a timing chart showing changes over time of various signals output by the timing generator of the present invention and changes over time of a power supply variation.

FIG. 3 is an adjustment image diagram showing the flow of the adjustment of the current amount of the heater circuit.

The adjustment of the current amount of the heater circuit is carried out in the following procedure.

(1) The period of the ring oscillator in a state in which the timing generator 20a is not in operation (stand-by state, inactive state) is measured ((c) in FIG. 3, a first CTR measurement period).

(2) The aimed circuit alone is set to be in operation, and the period of the ring oscillator 31 is measured in accordance with the start of the timing generating operation ((a), (b) in FIG. 3) by the trigger signal (TGSTART) ((c) in FIG. 3, a second CTR measurement period). It is to be noted that the state after the start of the timing generating operation is called an "active state".

(2-1) First, the delay circuit 25-1 is adjusted. As a setting in which the data in the FIFO 24 shown in FIG. 1 does not change, "ENB1='H'" and "ENB2='L'" are set so that the delay circuit 25-1 passes the pulse, signal and the delay circuit 25-2 does not pass the pulse signal.

(2-2) After the adjustment of the delay circuit 25-1, "ENB1='H'" and "ENB2='H'" are set as a setting in which the data in the FIFO 24 does not change, so that both the delay circuit 25-1 and the delay circuit 25-2 pass the pulse signal.

(2-3) After the adjustment of the delay circuit 25-1 and the delay circuit 25-2, a setting is made in which the data in the FIFO 24 changes.

(3) The current amount of the heater is adjusted so that the difference between the periods of (1) and (2) is minimized ((d) in FIG. 3).

It is to be noted that an average value of variations of an oscillation period of ROSC due to load regulation is measured as a power supply variation (difference between the active state and the stand-by state).

When the current amount of the heater circuit is adjusted in such a procedure, adjustment is made so as to minimize the difference between the periods of the output from the ring oscillator in the operating and inactive states of the timing generator. It is thus possible to keep a constant sum of the consumption amount of electric power in the delay circuit and the interpolation amount in the heater circuit. Therefore, it is possible to suppress the deterioration in the accuracy of the delay time due to a temperature variation resulting from the variations in the consumed electric power of the delay circuit itself and due to load variations of a power supply.

Furthermore, the consumption current balance circuit in the present embodiment is provided in the timing generator 20, as shown in FIG. 1, etc. Thus, in the timing generator 20, it is possible to increase the accuracy of the delay time given to the timing pulse signal.

Moreover, the timing generator 20 comprising the consumption current balance circuit in the present embodiment can be provided in a semiconductor testing apparatus 1 as shown in FIG. 6. Thus, in the semiconductor testing apparatus 1, a semiconductor test is carried out using the timing pulse signal having the improved accuracy of the delay time, such that a more accurate test result can be obtained.

Next, the operation of the consumption current balance circuit of the present invention will be explained with reference to FIG. 4.

Figure 4:
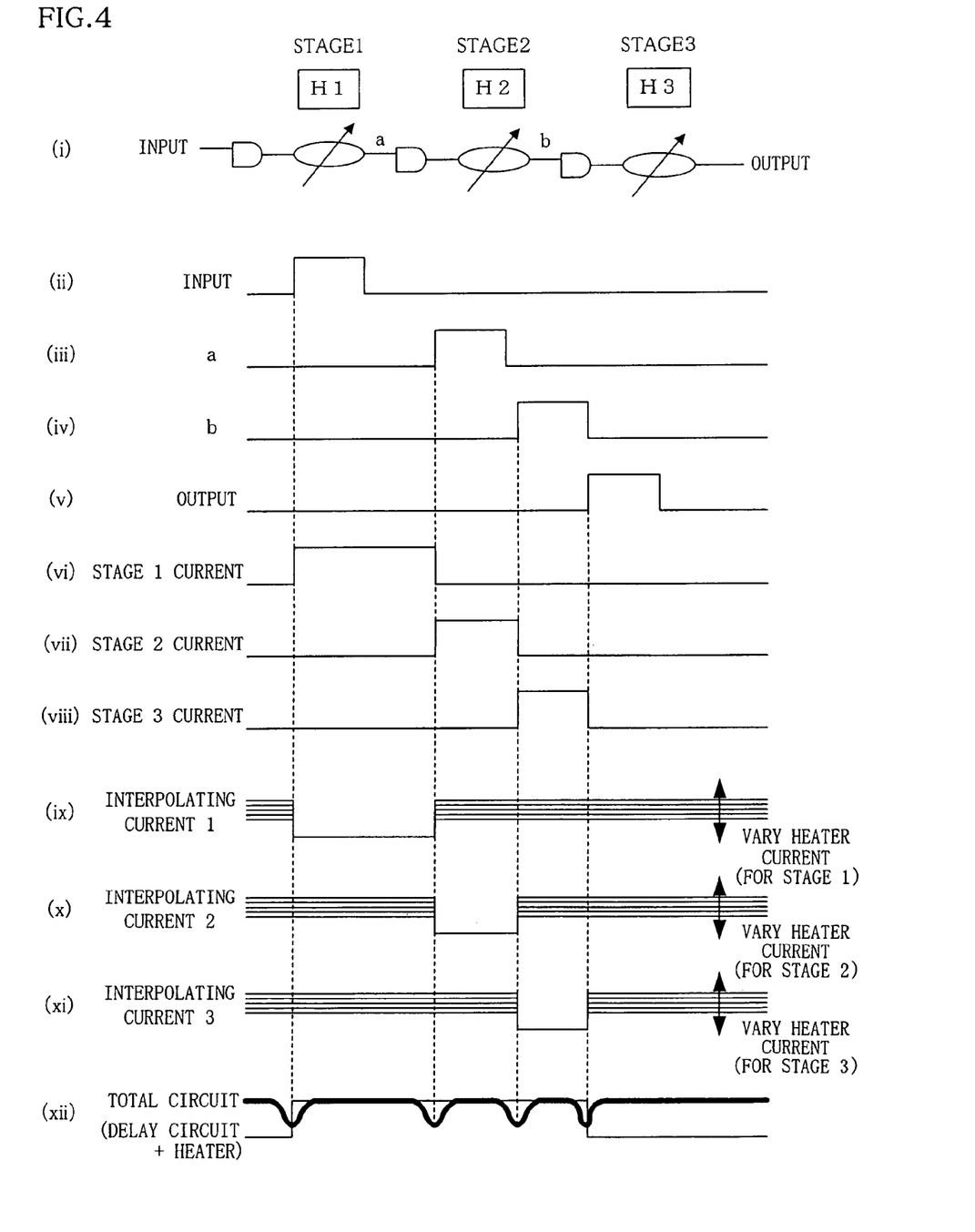
FIG. 4 is a circuit diagram and a timing chart for explaining the operation of a consumption current balance circuit of the present invention.

The stages (STAGE 1, STAGE 2, STAGE 3) are separated by the waveform passage inhibition gates 30 (AND gates) ((i) in FIG. 4).

The CMOS circuit applies a current only during the passage of a pulse.

As shown in FIG. 4, the current to run in each stage only runs during the pulse passage ((ii) to (v) in FIG. 4 for the "pulse passage", and (vi), (vii) and (viii) for the "STAGE current".

An interpolating circuit is controlled so that it is turned off only when the pulse is passed in the delay circuit, whereas it is controlled so that a set current may run when the pulse is not passed ((ix), (x) and (xi) in FIG. 4).

When the current of the heater does not run at all, a total current (currents running in the delay circuit and the heater) is as indicated by a thin full line shown by (xii) in FIG. 4. However, when the heater is set at an optimum value, the total current is at a constant value in the vicinity of the maximum value as indicated by a thick full line.

It is to be noted that FIG. 4 only shows electric power consumption based on the passage of a front edge for clearer explanation.

Figure 5:
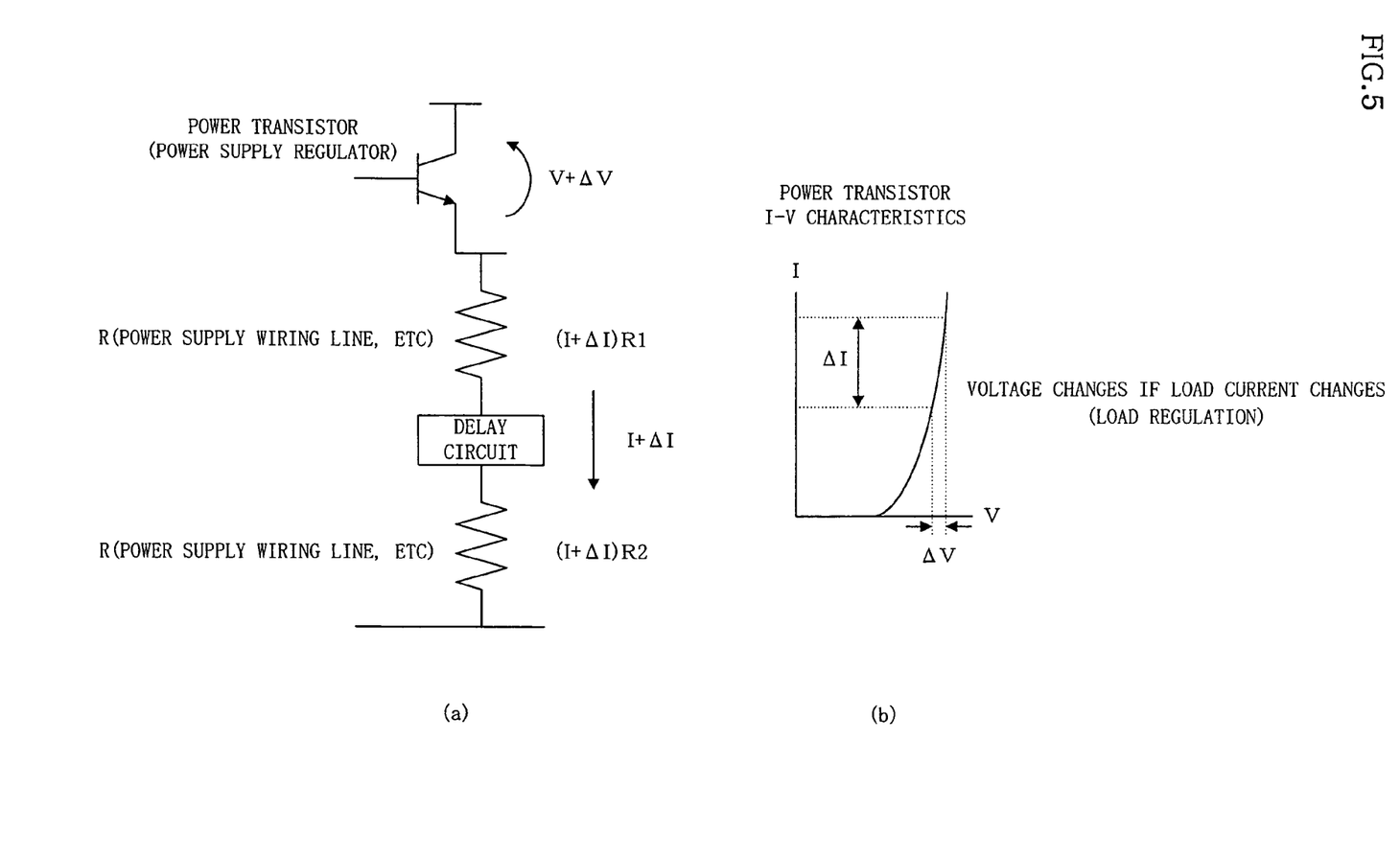
FIG. 5 is a circuit diagram for explaining the operation of the consumption current balance circuit of the present invention, and is an I-V characteristic graph of a power transistor.

Furthermore, in a circuit shown in (a) of FIG. 5, if the consumed current of the delay circuit changes by $\Delta I$, the voltage applied to the delay circuit decreases by a value calculated by the following equation.

Voltage drop amount=$\Delta V + \Delta I \cdot (R1+R2)$  (Equation 1)

A value obtained by this Equation 1 is as shown in (b) of FIG. 5.

For example, in the CMOS, a propagation delay time changes by about 0.04% to 0.11% per millivolt, so that the delay time varies for the voltage drop amount calculated by Equation 1 which is multiplied by this voltage coefficient (accuracy deterioration).

Variation of propagation delay time=0.11 [%/mV]·
($\Delta V + \Delta I \cdot (R1+R2)$)·$Tpd$(propagation delay time)  (Equation 2)

Even if the operating rate of the delay circuit changes, the accuracy deterioration due to a voltage drop does not occur as long as there is not any change in the sum of the currents running in the whole delay circuit.

From what has been described, it is understood that keeping a constant current value of the CMOS is important to prevent the deterioration of accuracy.

While the preferred embodiment of the consumption current balance circuit, the compensation current amount adjusting method, the timing generator, and the semiconductor testing apparatus of the present invention has been described above, it goes without saying that the consumption current balance circuit, the compensation current amount adjusting method, the timing generator, and the semiconductor testing apparatus according to the present invention are not exclusively limited to the embodiment described above, and various modifications can be made within the scope of the present invention.

For example, the heater circuit is used as a compensation circuit of the delay circuit in the configuration of the embodiment described above, but the compensation circuit is not limited to the heater circuit, and, for example, a dummy circuit shown in FIG. 7 can also be used as the compensation circuit. That is, the present invention can also be utilized in the consumption current balance circuit and the timing generator using the dummy circuit. However, the heater circuit can achieve a smaller layout area than the dummy circuit.

INDUSTRIAL APPLICABILITY

The present invention is an invention concerning a technique for adjusting a compensation current in a consumption current balance circuit of a timing generator, and can therefore be utilized for an apparatus comprising a consumption current balance circuit, a compensation circuit, a timing generator, etc.

The invention claimed is:

1. A consumption current balance circuit which includes a delay circuit to give a delay time to an output signal, and a compensation circuit to interpolate a consumption current of the delay circuit, the consumption current balance circuit characterized by comprising:

a heater circuit provided as the compensation circuit in the vicinity of the delay circuit;

an oscillator provided in the same power supply area as the delay circuit;

a period counter which measures an output period of the oscillator; and a heater circuit current amount adjusting circuit which adjusts the current amount of the heater circuit so as to minimize the difference between the output period of the oscillator in an inactive state and the output period of the oscillator in an active state.

2. The consumption current balance circuit according to claim 1, comprising:

a waveform passage inhibition gate which inhibits the passage of a waveform for each stage of the delay circuit, wherein the heater circuit current amount adjusting circuit adjusts the current amount of the heater circuit for each stage and/or for each circuit so as to minimize the difference between the output period of the oscillator in the inactive state and the output period of the oscillator in each active state for each stage of the delay circuit.

3. A compensation current amount adjusting method which adjusts the amount of a compensation current running in a heater circuit to interpolate the consumption current of a delay circuit, the method characterized by comprising the steps of:

measuring an output period of an oscillator provided in the same power supply area as the delay circuit by use of a period counter in an inactive state;

switching a waveform passage inhibition gate so that the delay circuit operates for each stage;

measuring the output period of the oscillator in an active state of the stages for each stage of the delay circuit by use of the period counter; and adjusting, by use of a heater circuit current amount adjusting circuit, the current amount of the heater circuit so as to minimize the difference between the output period of the oscillator in an inactive state and the output period of the oscillator in the active state for each stage of the delay circuit.

4. A timing generator for generating timing signals, comprising:

a delay circuit to give a delay time to a timing pulse signal; and a compensation circuit to interpolate a consumption current of the delay circuit, the timing generator comprising:

a consumption current balance circuit which adjusts the amount of a compensation current running in the compensation circuit, wherein the consumption current balance circuit is configured by elements described in claim 1.

5. The timing generator according to claim 4, comprising:

a trigger signal output circuit which outputs a trigger signal to perform a timing generation operation, wherein the period counter of the consumption current balance circuit measures the output period of the oscillator provided in the same power supply area as the delay circuit when the trigger signal is output from the trigger signal output circuit to start the timing generation operation.

6. A semiconductor testing apparatus for testing semiconductor devices, comprising:

a timing generator which outputs a delayed clock signal obtained by delaying a reference clock signal for a predetermined time;

a pattern generator which outputs a test pattern signal synchronously with the reference clock signal;

a waveform shaper which shapes the test pattern signal in accordance with a device under test and sends the shaped test pattern signal to the device under test; and a logical comparator which compares a response output signal of the device under test with an expected value data signal, wherein the timing generator is configured by elements described in claim 4.

* * * * *